United States Patent [19]

Freer et al.

[11] 4,117,472
[45] Sep. 26, 1978

[54] LIQUID CRYSTAL DISPLAYS

[75] Inventors: William Gordon Freer, Leavesden; Hugh Andrew Pincherle; William Thomas Moore, both of London, all of England

[73] Assignee: The Rank Organisation Limited, London, England

[21] Appl. No.: 767,813

[22] Filed: Feb. 11, 1977

[30] Foreign Application Priority Data

Feb. 11, 1976 [GB] United Kingdom ............... 5356/76

[51] Int. Cl.² .............................................. G06F 3/14
[52] U.S. Cl. ................................ 340/324 M; 350/333; 340/336
[58] Field of Search ............. 340/324 R, 324 M, 336; 350/160 LC

[56] References Cited

U.S. PATENT DOCUMENTS 3,653,745  4/1972  Mao ........................................ 34/336
3,891,307  6/1975  Tsukamoto ...................... 340/324 R
3,898,642  8/1975  Dorey et al. ..................... 340/324 R
3,934,241  1/1976  Weigert ........................... 340/324 R Primary Examiner—Marshall M. Curtis
Attorney, Agent, or Firm—Brisebois & Kruger

[57] ABSTRACT

A liquid crystal display device comprising a plurality of liquid crystal elements each having a respective pair of electrodes which are connected in matrix formation for control purposes. Electrodes on one side of the elements are connected in "rows" and electrodes on the other side of the elements are connected in "columns" so that intersections define an element uniquely while reducing the number of control terminals. The "rows" may be formed as a sinuous array crossing and recrossing an elongate array formed by the "columns" so that the display provides a linear progressive illuminable display area. Control signals may be variable in phase, and/or frequency and/or amplitude to effect appropriate selective activation of the elements.

5 Claims, 6 Drawing Figures

LIQUID CRYSTAL DISPLAYS

The present invention relates to optical displays, and particularly to a liquid crystal optical display device.

Liquid crystal displays are known as such. These comprise a nematic liquid, that is one in which the molecules are elongate, sandwiched in a thin film between two electrodes. One or both of the electrodes may be transparent. The nematic liquid in such a liquid crystal cell generally has either a high positive or a high negative electrical anisotropy, that is the dielectric constant parallel to the long molecular axis is respectively greater than or less than the dielectric constant perpendicular to the long axis of the molecules. When such nematic liquids are sandwiched between two plates, particularly plates having linear surface formations such as grooves or furrows, they can be caused to adopt an orientation in which the majority of the molecules are aligned parallel with one another, or one in which they have a predetermined variation in their alignment such as a twist of the molecular axis between the two plates. The application of a mechanical disturbance or an electric field across the plates defining the cell can then be used to create a disturbance in the molecular alignment, which molecular alignment is re-established upon removal of the perturbing mechanical disturbance or electric field. Changes to the molecular orientation of a liquid crystal material cause corresponding changes to the optical anisotropy of the liquid crystal layers, so that polarised light traversing a twisted nematic liquid crystal layer will have its plane of polarisation rotated upon transmission.

These variations in the optical properties of the liquid crystal material in such cells can be used in display devices, for example by selectively blocking or transmitting polarised light by causing its plane of polarisation to be rotated or not upon transmission through the cell by selectively applying a potential difference across the electrodes on or forming the walls of the cell. For certain applications it is desirable to use a large number of nematic liquid crystal elements in what is sometimes termed an "analogue" display where one or a plurality of liquid crystal elements in an array are to be activated so that they transmit or block light incident thereon, the remaining elements blocking or transmitting the light as appropriate. Such an array may be formed as a matrix, for example, with the liquid crystal elements in a series of rows and columns, or may be formed as a single linear array for the purpose of providing an indication, for example, of a reading of a measuring instrument such as a thermometer. In such cases, however, a very large number of liquid crystals may be used: for example, for a linear array requiring a resolution of 0.5%, it would be necessary to use 200 elements and in order to drive these elements individually there are required 200 separate electrodes each on one side of a respective element, and a common "backing" electrode linking all the elements on the other side thereof from the said one side. For these electrodes there are required 200 connecting terminals to link the cells to a suitable electronic drive system. This requires a considerable complexity of mechanical interconnections and increases the risk of faults in the system due to faulty connections.

The present invention seeks to provide a drive system for a liquid crystal display having a plurality of liquid crystal elements, in which the number of electrode connections, and therefore the number of terminals to drive leads, can be substantially reduced.

According to the present invention there is provided a nematic liquid crystal display of the type comprising a plurality of liquid crystal elements each having a pair of electrodes, characterised in that one of the electrodes of each element is connected in one group of a first set of groups of electrodes and the other electrode of each element is connected in one group of a second set of groups of electrodes, the connections being such that the said one electrode and the said other electrode of any one element are members of two groups for which no other element has both electrodes as members, and means for applying to each group of electrodes a respective waveform signal, the signals being related in amplitude and phase such that a selected element or plurality of elements, is activated thereby.

Each element is therefore uniquely addressed by applying a signal to one of the groups of the first set and one of the groups of the second set so that, providing the voltage difference imparted between the two signals is greater than a threshold value at which the liquid crystal effect takes place, the liquid crystal element will commute from one state to the other changing its optical characteristics as outlined above. Since it may be required to address more than one element of the liquid crystal display the waveforms may be applied to a plurality of groups, and in this case the relative amplitudes and phases of the signals must be so arranged that only the desired elements are activated.

In one embodiment of the present invention the groups of the first and second sets are arranged in "rows" and "columns" in matrix form, each group comprising a substantially linear array of electrodes. Alternatively, one set of groups is arranged as a sinuous elongate array and the other set of groups is arranged as a substantially linear array which is crossed and recrossed by the said sinuous elongate array. This latter arrangement provides an effectively linear array of elements of the liquid crystal display, and these can be energised sequentially so that all the elements to one side of a given element are activated and all the elements to the other side of the given element are not activated by applying suitable waveforms to the groups as will be discussed below. In such a linear array it is preferred that each liquid crystal element of the display and each electrode of one set of groups, is elongate and extends transverse the length of the array of said other set of groups, that is transverse the length of the display.

In order to select the desired elements for activation, it is preferred that the means for applying a waveform signal to each group of electrodes is operative to apply to a selected group or groups of the display, a first waveform signal the amplitude of which is greater than the threshold voltage required for activation of the liquid crystal material but less than that which will produce the maximum effect, and to apply to the other groups of the display, signals the amplitude of which is less than the said threshold value but which is such that the difference between this amplitude and that of the said first signal is in the region of that which will produce the maximum effect when the two signals are of opposite phase but is less than the said threshold value when the two signals are in phase, the phase of the signals being such that one or more selected elements are activated. In such a system utilising only regular waveforms of one of two amplitudes and one of two phases it is only possible to select elements for activation within a group to which the higher amplitude signal is applied. In order to obtain a greater degree of independence, an alternative system may be used in which the means for applying a waveform signal to each group of electrodes is operative to apply to each group of the first set one of two waveform signals $E_0$, $E_1$ and to apply to each group of the second set one of three waveform signals $B_0$, $B_1$, $B_2$ which are related in amplitude and phase such that the RMS values of the differences $E_0-B_0$, $E_0-B_1$ and $E_1-B_0$ are below the threshold value for the liquid crystal elements, and the RMS values of the differences $E_0-B_2$, $E_1-B_1$ and $E_1-B_2$ are above the threshold value for the liquid crystal elements. In this case there are five different waveforms each of which has one of two maximum amplitudes. It is however possible to make use of waveform signals having only one given maximum amplitude if the liquid crystal material in the elements is one the dielectric anisotropy of which changes sign with changes in the drive frequency since in this case the means for applying a waveform signal to each group of electrodes may be operable to apply to each group a waveform of the said given maximum voltage, but with different waveforms having different frequencies. In such a case it is preferred that the dielectric anisotropy of the liquid crystal material is such that it changes from a positive to a negative value on an increase of the drive frequency above a threshold frequency. A suitable material for this purpose is marketed by the Merck Chemical Company under the code ZLI 518.

Various embodiments of the present invention will now be more particularly described, by way of example, with reference to the accompanying drawings, in which.

Figure 1:
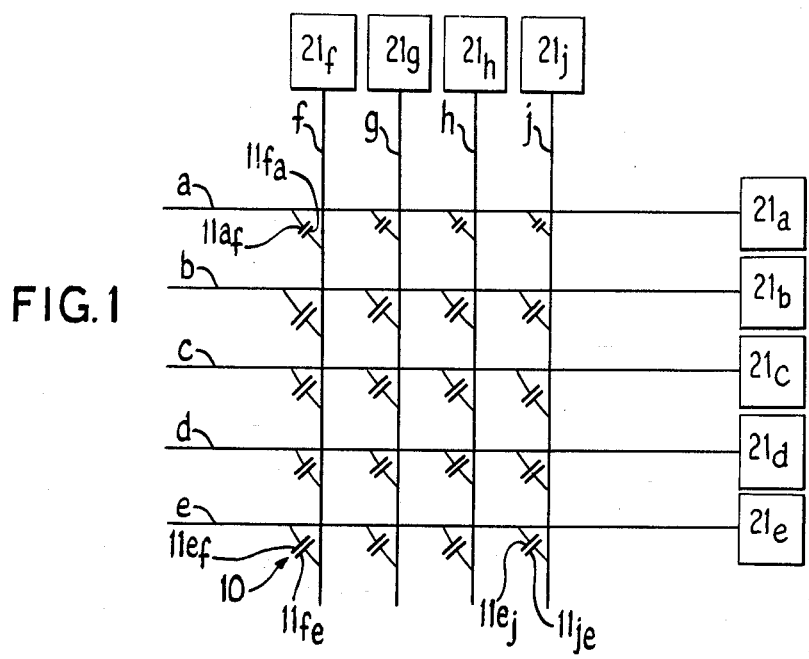
FIG. 1 is a schematic diagram illustrating a matrix of liquid crystal elements suitable for control by a drive system according to the present invention.
Figure 2:
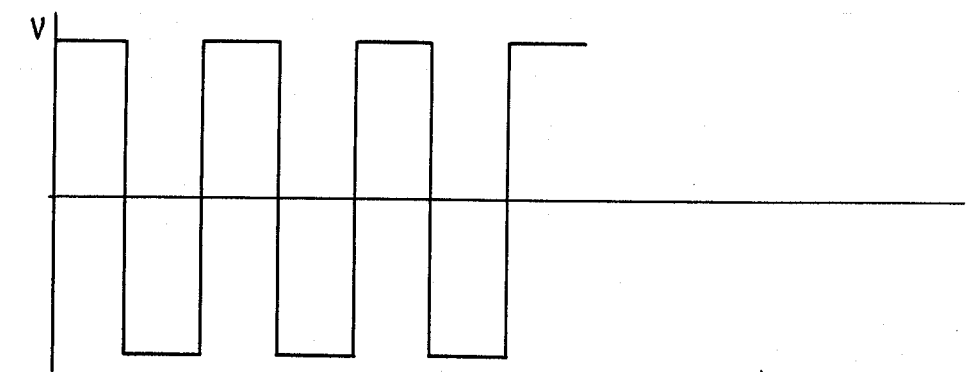
FIG. 2 is a waveform diagram illustrating a set of waveforms suitable for use in embodiments of the present invention.
Figure 2:
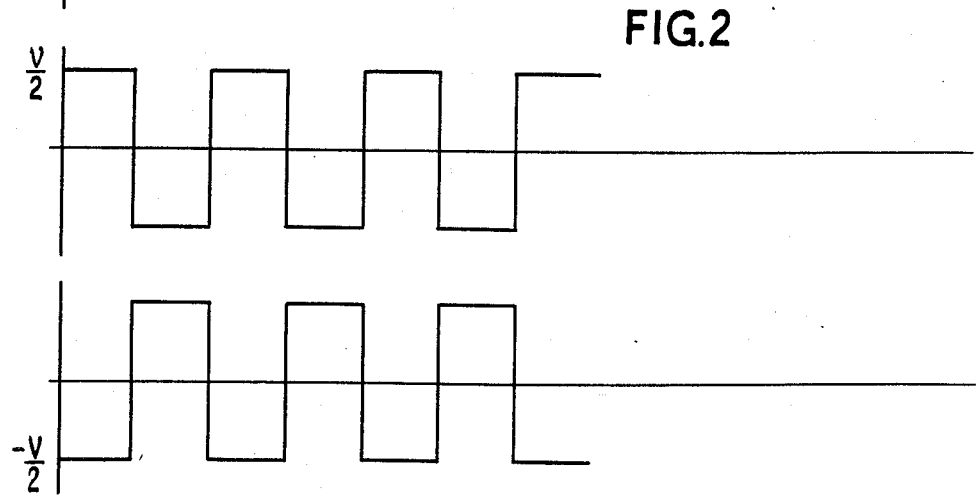

Referring now to the drawings, in FIG. 1 there is shown a matrix of five rows and four columns of liquid crystal elements generally indicated 10, each having two electrodes 11. The rows are identified by the reference letters $a$, $b$, $c$, $d$, $e$, and the columns are identified by the reference letters $f$, $g$, $h$, $j$. The electrodes on one side of each of the elements 10 in row $a$ are connected together in a group, each member of the group being indicated by the reference $11a$ with a subscript relating to the column in which the liquid crystal element is found. Thus, for example, the electrode in group $a$ belonging to the top left hand electrode 11 will be indicated $11a_f$. The electrode in group $a$ belonging to the liquid crystal element 10 in the next position will be indicated $11a_g$ and so on.

Correspondingly, the other electrode of each liquid crystal element 10 is connected in a respective group, the groups being arranged in columns. Thus, the electrode in column $f$ belonging to the liquid crystal element 10 in row $a$ will be indicated $11f_a$, and so on.

In accordance with the invention, a selected liquid crystal element 10 can be activated by applying to the appropriate column a first waveform, and applying to the selected row a second waveform such that the difference between the waveforms (RMS value) is greater than the threshold value for the activation of the liquid crystal. Each row or column is shown as having an associated waveform generator 21 individually identified by the rows or columns to which they are connected. Thus, the waveform generator 21 connected to row $a$ is referenced $21a$ and the waveform generator connected to column $g$ is referenced $21g$. Although shown in individual units in FIG. 1, it will be appreciated that the waveform generator 21 could all be part of the same circuit, all fed, for example, from a master oscillator and containing divider circuits for modifying the frequency, appropriate amplifiers or attenuators for modifying the amplitude, and phase changing circuits for modifying the phase.

Figure 3:
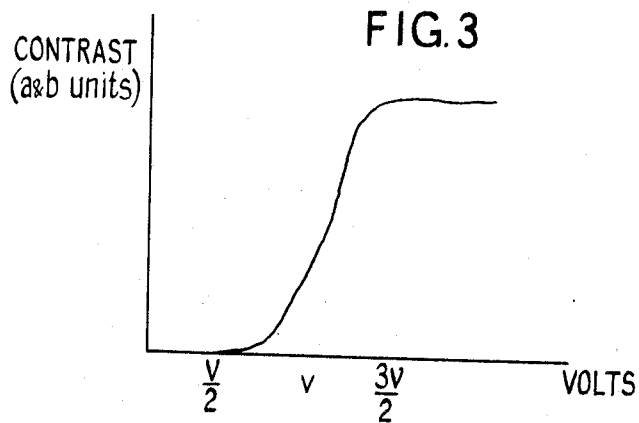
FIG. 3 is a diagram illustrating a typical response characteristic of a liquid crystal element.

In this case, the electrodes in the column group $g$ have applied to them from the waveform generator $21g$ a first signal the maximum amplitude of which has a value $v$ which is approximately twice the threshold voltage for the liquid crystal effect. As will be seen from FIG. 3, the value $v/2$ is the threshold voltage for the liquid crystal effect, and the value $3v/2$ is preferably above that required to give the maximum contrast characteristic of the liquid crystal effect. The signal of amplitude $v$ applied to the electrodes of the elements in column $g$ would thus cause a partial activation of all the elements in that column.

The waveform generators $21a$, $21b$, $21c$, $21d$, $21e$, however, apply to the electrodes in the rows $a$, $b$, $c$, $d$, $e$, respective waveforms having a maximum amplitude of $v/2$ but with phases related to that of the waveform applied to the column $g$ such that the rows $a$, $c$, $d$, $e$, are all in phase with the signal applied to column $g$ and the row $b$ is 180° out of phase with this signal. The RMS difference between the voltage applied to the liquid crystal elements 11 in column $g$ rows $a$, $c$, $d$, and $e$ thus have an RMS value of $v/2$ and therefore these elements are not activated. The element in row $b$ column $g$, however, is fully activated since the difference between the signal applied to electrode $11g_b$ and the signal applied to the electrode $11b_g$ is $3v/2$. By suitably changing the phases of the signals applied to columns $a$, $c$, $d$ or $e$ to be $\pi$ out of phase with the signal applied to column $g$, any element in column $g$ can be activated.

Figure 4:
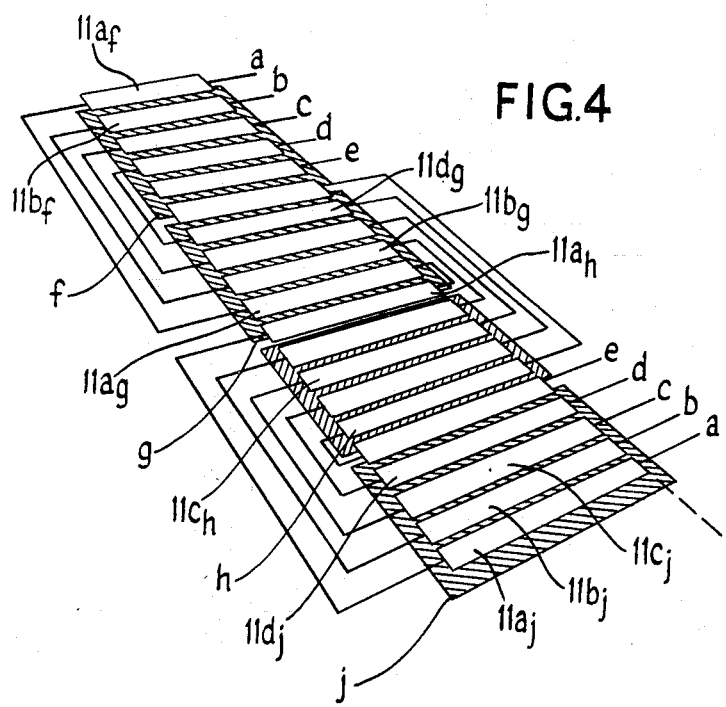
FIG. 4 is a schematic diagram of a liquid crystal display having a linear array of elements, connected in a manner suitable to be driven in accordance with the present invention.

Referring now to FIG. 4 there is shown an array of elements connected as in FIG. 1 in a matrix formation, but arranged as a linear array. In this embodiment the same terminology will be used to indicate the "row" electrodes $11a$, $11b$, $11c$, $11d$, $11e$, with respective suffixes indicating the columns $f$, $g$, $h$, $j$. In this embodiment, however, the "row" electrodes are connected in a sinuous array while the "column" electrodes are connected in groups in a linear array which is crossed and re-crossed by the sinuous array so that the liquid crystal elements 10 are arranged in a linear array. For convenience, only the electrodes are illustrated, it being assumed that a suitable nematic liquid crystal material would be interposed in a known way between each pair of appropriate electrodes. Likewise the waveform generators 21 are not shown since these may be any conventional devices for providing the required waveforms which will be discussed below.

The group a of electrodes connected in the sinuous array thus comprises the first electrode along the array, the tenth electrode, the eleventh electrode and the twentieth electrode, The "column" electrodes of a group are, in fact, formed as a common plate so that, in this embodiment, all of the electrodes $11g_a$, $11g_b$, $11g_c$, $11g_d$ and $11g_e$ are formed as a common electrode $11g$.

Figure 5:
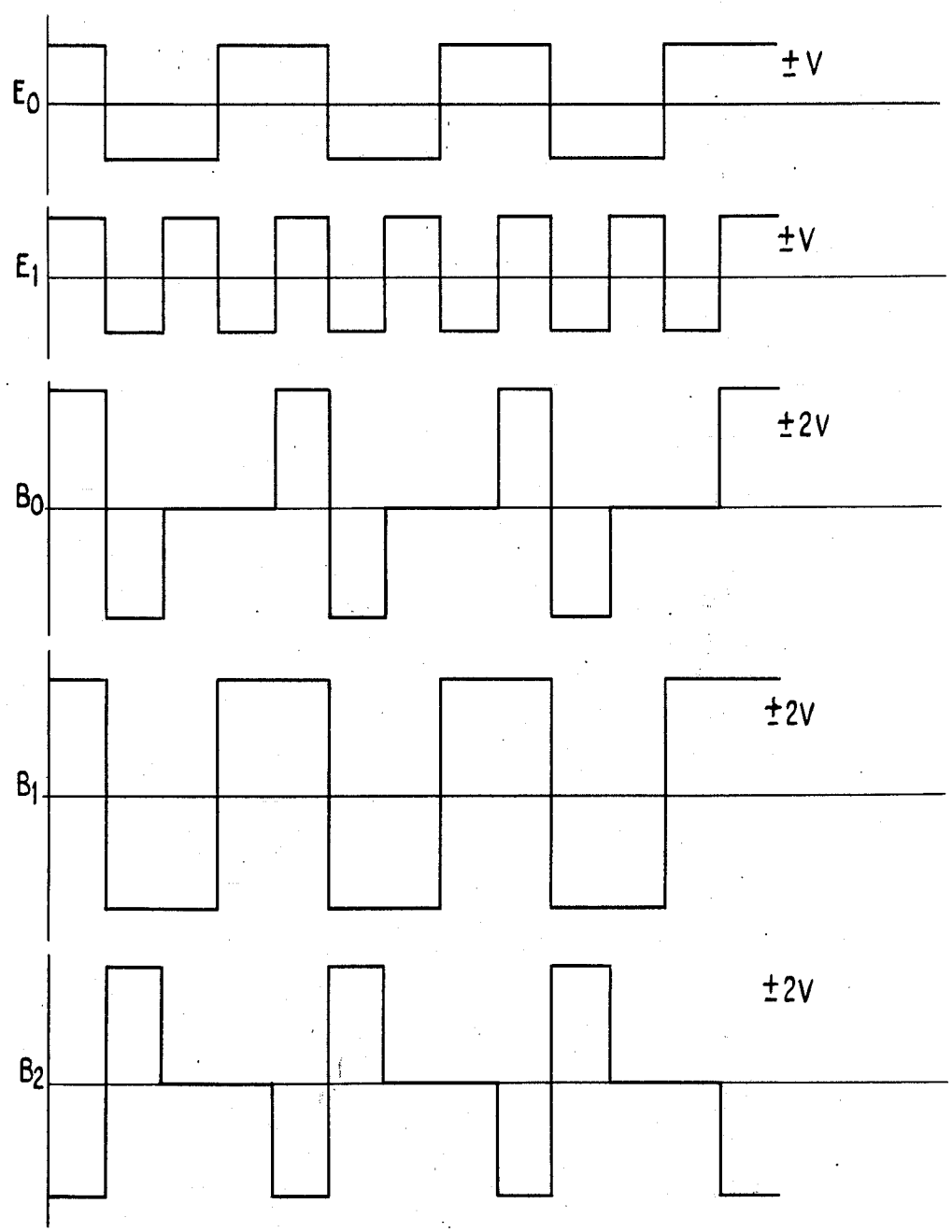
FIG. 5 is a set of waveform diagrams illustrating one set of five waveforms suitable for use in driving a liquid crystal display in accordance with the invention.

In FIG. 5 there are shown a set of five waveforms which can be used in order sequentially to activate the elements from one end to the other. The waveforms are indicated $E_0$, $E_1$, $B_0$, $B_1$, and $B_2$. The maximum amplitude of the signals $E_0$ and $E_1$ is $\pm v$ and the maximum amplitude of the signals $B_0$, $B_1$ and $B_2$ is $\pm 2v$. In this case, it is assumed that the voltage level $v$ is the threshold for the liquid crystal effect. From a consideration of the waveforms it will be seen that the differences between these voltages (RMS values) are as follows:

$$E_0 - B_0 = v$$

$$E_0 - B_1 = v$$

$$E_0 - B_2 = 2.24v$$

$$E_1 - B_0 = v$$

$$E_1 - B_1 = 2.24v$$

$$E_1 - B_2 = 2.24v$$

To optimize the ratio $V_{OFF}:V_{ON}$ (R.M.S.) the amplitudes of the waveforms are found not necessarily to be in the simple ratio of 2:1.

These waveforms can be applied to the "rows" a, b, c, d, e and "columns" f, g, h, j in such a manner as to cause the elements 11 to be activated sequentially in the manner of a thermometer scale. This can be achieved, for example, by applying signal $B_1$ to coulmn f and signal $B_0$ to columns g, h, and j. Then, if waveform $E_0$ is applied to "rows" b, c, d, and e, while waveform $E_1$ is applied to row a, the potential difference between electrodes $11a_f$ and $11f_a$ will be $E_1 - B_1 = 2.24v$ whereas for all other electrodes in the "column" f the potential difference will be $E_0 - B_1 = v$. All the other electrodes of the "rows" will be at a potential difference with their corresponding "column" electrodes of $E_0 - B_0 = v$ so that only the element $11a_f$ will be activated. The subsequent elements $11b_f$, $11c_f$, $11d_f$ and $11e_f$ can be activated in turn by sequentially applying to "rows" b, c, d, and e the waveform $B_1$. When it is required to activate the sixth element (element $11e_g$) the electrode $11g$ has the waveform $B_1$ applied to it, and in order to avoid the seventh, eighth, ninth and tenth liquid crystal elements identified by references $11d_g$, $11c_g$, $11b_g$ and $11a_g$ the "rows" d, c, b, and a are returned to waveform $E_0$. To maintain elements $11a_f$ to $11e_f$ activated the electrode $11f$ is now fed with signal $B_2$ so that electrodes $11a_f$ to $11d_f$ are at a potential difference of $E_0 - B_2 = 2.24v$ and the elements are therefore activated, element $11e_f$ is at a potential difference of $E_1 - B_2 = 2.24v$ and is activated, and element $11e_g$ is at a potential of $E_1 - B_1 = 2.24v$ and is therefore activated. The remaining elements associated with electrode g are at a potential of $E_0 - B_1 = v$ and are therefore not activated and the elements associated with electrodes h and j are unchanged and are therefore not activated. Thus, by sequentially feeding the electrodes f, g, h and j with the signals $B_0$, $B_1$ or $B_2$ the activation of the liquid crystal element can be controlled, in conjunction with the feeding of the "row" electrodes a, b, c, d, e with the waveforms $E_0$ or $E_1$.

Figure 6:
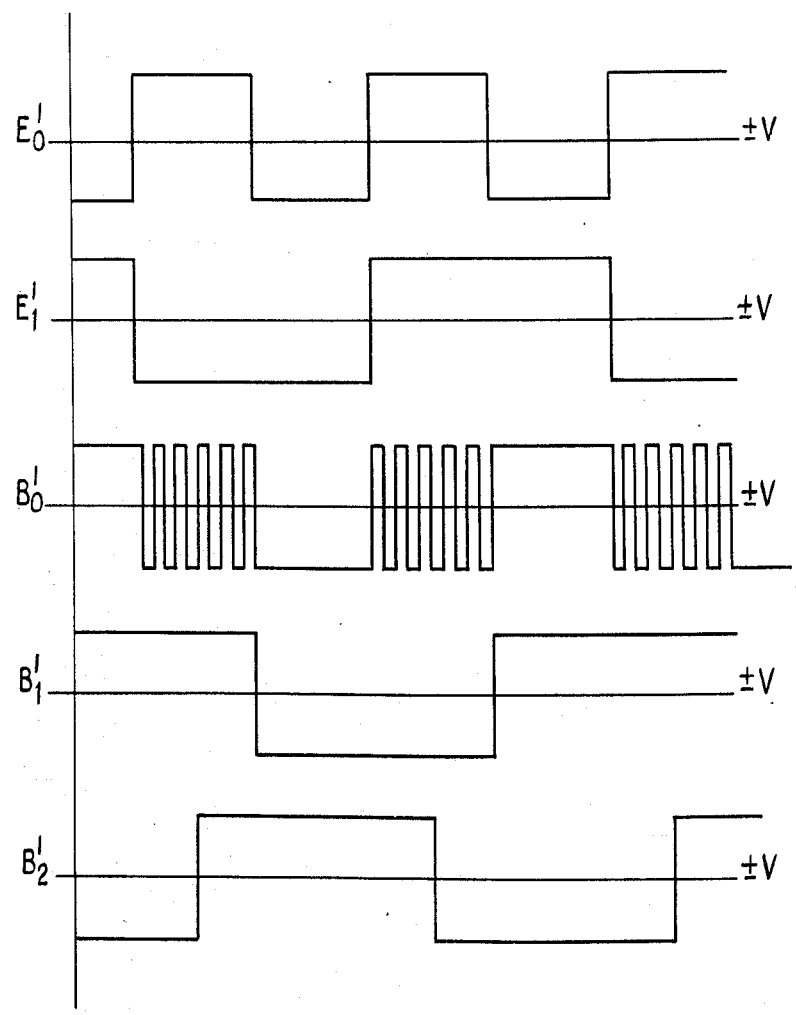
FIG. 6 is a set of waveform diagrams illustrating five further waveforms suitable for use with the invention.

The waveforms $E_0$, $E_1$ and $B_0$, $B_1$, $B_2$ involve the use of two separate voltage levels $\pm v$ and $\pm 2v$. If it is desired to control a display utilising only one voltage level, this can be achieved if the liquid crystals used are of a type the dielectric anisotropy of which changes from a positive value to a negative value on increasing drive frequency. FIG. 6 illustrates a set of five waveforms $E'_0$, $E'_1$, $B'_0$, $B'_1$ and $B'_2$ which may be used in substitution for the waveforms shown in FIG. 5 to control a display such as that illustrated in FIG. 4.

We claim:

1. In a nematic liquid crystal display comprising:
   a plurality of liquid crystal elements,
   respective pairs of electrodes associated with each of said liquid crystal elements whereby an electric potential across a pair of electrodes above a threshold value can cause activation of said liquid crystal material,
   means connecting one of the pair of electrodes of each element in one group of a first set of groups of electrodes,
   means connecting the other electrode of each element in one group of a second set of groups of electrodes,
   said means connecting said electrodes such that said one electrode and said other electrode of any one element are members of two groups for which no other element has both electrodes as members, and
   means for applying to each said group of electrodes a respective waveform signal,
   the improvement wherein:
   said means for applying a waveform signal to each group of electrodes operates to apply to each group of electrodes of said first set a first or a second waveform signal and to apply to each group of said second set of electrodes a third or a fourth or a fifth waveform signal, said first, second, third, fourth and fifth waveform signals being related in amplitude and phase to each other such that the RMS values of the differences between said first and said third signals, and between said first and said fourth signals, and between said second and said third signals are below said threshold value for said liquid crystal elements, and the RMS values of the differences between said first and said fifth signals, and between said second and said fourth signals, and between said second and said fifth signals are above said threshold value for said liquid crystal elements.

2. A nematic liquid crystal display, as in claim 1, wherein one set of said groups of electrodes is arranged as a sinuous elongate array and the other said set of groups of electrodes is arranged as a substantially linear array which is crossed and recrossed by said sinuous elongate array of electrodes, and each electrode of said first set of groups of electrodes is elongate and extends transverse the length of the array of said other set of groups of electrodes.

3. A liquid crystal display as in claim 1, wherein each group of electrodes of the second set of groups is formed as a single common electrode constituting the whole of each said group.

4. A liquid crystal display as in claim 1, wherein said means for applying a waveform signal to each group of electrodes is operable to apply to each group a waveform of a given maximum voltage, different waveforms having different frequencies, and wherein said liquid crystal material of said elements is one the dielectric anisotropy of which changes sign with changes in the drive frequency.

5. A liquid crystal display as in claim 4, wherein said liquid crystal material is one the dielectric anisotropy of which changes from a positive to a negative value upon an increase of the drive frequency above a threshold frequency.

* * * * *